United States Patent
Pramanick et al.

[11] Patent Number: 6,087,255
[45] Date of Patent: Jul. 11, 2000

[54] CONDUCTIVE LAYER WITH ANTI-REFLECTIVE SURFACE PORTION

[75] Inventors: Shekhar Pramanick, Fremont; Bhanwar Singh, Morgan Hill; Che-Hoo Ng, San Martin, all of Calif.

[73] Assignee: Advanced Micro Devices, Inc., Sunnyvale, Calif.

[21] Appl. No.: 09/127,887

[22] Filed: Aug. 3, 1998

Related U.S. Application Data

[62] Division of application No. 08/704,162, Aug. 28, 1996, Pat. No. 5,841,179.

[51] Int. Cl.$^7$ ................................ H01L 31/0236
[52] U.S. Cl. ...................... 438/659; 438/636; 438/952
[58] Field of Search ................... 438/636, 659, 438/486, 766, 952, 964, 969, 795, 665

[56] References Cited

U.S. PATENT DOCUMENTS

| | | | |
|---|---|---|---|
| 4,268,347 | 5/1981 | Stephens | 216/87 |
| 4,704,367 | 11/1987 | Alvis et al. | 438/659 |
| 4,771,010 | 9/1988 | Epler et al. | 438/36 |
| 4,820,611 | 4/1989 | Arnold, III et al. | 430/271.1 |
| 4,933,304 | 6/1990 | Chen et al. | 438/636 |
| 4,942,451 | 7/1990 | Tamaki et al. | 257/742 |
| 4,997,518 | 3/1991 | Madokoro | 438/646 |
| 5,076,674 | 12/1991 | Lynam | 359/274 |
| 5,124,780 | 6/1992 | Sandhu et al. | 257/344 |
| 5,139,974 | 8/1992 | Sandhu et al. | 438/652 |
| 5,166,093 | 11/1992 | Grief | 438/662 |
| 5,219,788 | 6/1993 | Abernathey et al. | 438/636 |
| 5,486,719 | 1/1996 | Sugiura et al. | 257/641 |
| 5,594,280 | 1/1997 | Sekiguchi et al. | 257/771 |
| 5,595,938 | 1/1997 | Miyazaki | 438/636 |
| 5,600,165 | 2/1997 | Tsukamoto et al. | 257/323 |
| 5,607,776 | 3/1997 | Mueller et al. | 428/472 |
| 5,639,687 | 6/1997 | Roman et al. | 438/69 |

FOREIGN PATENT DOCUMENTS

| | | |
|---|---|---|
| 0 465 264 A2 | 1/1992 | European Pat. Off. . |
| WO 94/07260 | 3/1994 | WIPO . |

*Primary Examiner*—Brian Dutton
*Assistant Examiner*—Maria Guerrero

[57] ABSTRACT

The application of a dissimilar anti-reflective coating on a conductive layer during photolithographic processing is avoided, as by modifying a portion of the upper surface of the conductive layer to exhibit anti-reflective properties. In an embodiment of the present invention, impurity ions are implanted into a portion of the upper surface of an aluminum or an aluminum-alloy conductive layer to render the upper portion substantially amorphous and, hence, decrease its reflectivity to perform an anti-reflective function.

25 Claims, 5 Drawing Sheets

CONDUCTIVE LAYER WITH ANTI-REFLECTIVE SURFACE PORTION

This application is a divisional of application Ser. No. 08/704,162 filed Aug. 28, 1996 now U.S. Pat. No. 5,841,179.

TECHNICAL FIELD

The present invention relates to semiconductor technology wherein a conductive pattern of a highly reflective material is formed by photolithographic and etching techniques. The present invention has particular applicability in sub-micron circuitry comprising metal lines.

BACKGROUND ART

In fabricating integrated circuit devices, one or more conductive layers, typically a metal such as aluminum or an aluminum alloy, is deposited and subsequently patterned to provide contacts and/or interconnections between various circuit components. Such processing typically comprises depositing a photoresist on the metal layer, exposing the photoresist to a light pattern and then developing to form the pattern. The patterned photoresist is then employed as a mask through which the underlying metal layer is selectively etched, as by high density plasma etching employing a chlorine-containing gas. The remaining photoresist is then removed leaving the desired metal pattern typically comprising a plurality of closely spaced metal lines. Metal, such as aluminum, exhibits a high reflectivity. Accordingly, conventional practices comprise depositing an anti-reflective coating on the metal layer, prior to photolithographic processing. The anti-reflective coating, which typically comprises titanium nitride, reduces interference effects and diffuse scattering. See, for example, Abernathey et al., U.S. Pat. No. 5,219,788, wherein various conventional anti-reflective materials are disclosed.

A conventional method of forming a conductive metal pattern is disclosed in Arnold, III et al., U.S. Pat. No. 4,820,611 and comprises, as shown in FIG. 1A, depositing metal layer 12, such as aluminum or an aluminum alloy, on a portion of an integrated circuit 10, and depositing an anti-reflective coating 16, notably titanium nitride, on metal layer 12. A photoresist layer 14 is formed on anti-reflective layer 16. A mask 20 containing light apertures 22 is positioned over photoresist layer 14. Light rays, indicated by arrows 18, are passed through apertures 22 exposing selected areas of photoresist layer 14. After development, the exposed areas of photoresist layer 14 and the underlying portions of anti-reflective layer 16 are removed as shown in FIG. 1B. Subsequently, metal layer 12 is etched to form a conductive pattern, such as an interconnect pattern, and photoresist mask 14 removed, as depicted in FIG. 1C. Anti-reflective coating 16 on the remaining metal pattern 12 can be retained or removed.

Conventional practices consistently comprise the deposition of an anti-reflective coating comprising a material which is dissimilar to the material of the underlying conductive layer on which the anti-reflective coating is deposited. The use of an anti-reflective layer comprising a material different from the material of the conductive layer disadvantageously involves costly processing in terms of additional materials, manipulative steps, equipment and production time. In fact, in a physical vapor deposition system, titanium nitride deposition is the rate limiting step.

Moreover, the ever increasing demands for semiconductor devices containing conductive patterns having increasingly narrower line widths and increasingly narrower interwiring spacings therebetween generate acute problems with respect to current photolithographic capabilities. Such demands for increased miniaturization necessitate the use of deep UV photo-imaging or image-developing operations requiring photoresist materials which are incompatible with titanium nitride. For example, Abernathey et al. provide a barrier layer of silicon on a titanium nitride anti-reflective coating to avoid the generation of defects attendant upon depositing an acid-catalyzed photoresist on a titanium nitride anti-reflective layer.

Accordingly, there exists a need for photolithographic technology which avoids the use of an anti-reflective film of a material different from that of the underlying conductive layer while satisfying the demands for increasingly smaller conductive line widths and smaller interwiring spacings.

DISCLOSURE OF THE INVENTION

An object of the present invention is a semiconductor device comprising an interconnection pattern formed with an anti-reflective material similar to that of the interconnection pattern.

Another object of the present invention is an efficient, cost-effective method of manufacturing a semiconductor device having an interconnection pattern employing an anti-reflective material similar to that of the interconnection pattern.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a substrate; an insulating layer formed on the substrate; and a conductive layer having an upper surface and a lower surface formed above the insulating layer; wherein the upper surface comprises an anti-reflective upper portion extending into the conductive layer.

Another aspect of the present invention is a semiconductor device comprising: a substrate; an insulating layer formed on the substrate; and a conductive layer having an upper surface and a lower surface formed above the insulating layer; wherein the upper surface comprises a substantially amorphous anti-reflective upper portion extending into the conductive layer while the remaining portion of the conductive layer is substantially crystalline.

A further aspect of the present invention is a method of manufacturing a semiconductor device, which method comprises: forming an insulating layer on a semiconductor substrate; forming a single conductive layer having an upper surface and a lower surface above the insulating layer; and converting the upper surface of the conductive layer to form the anti-reflective upper portion extending into the conductive layer.

Another aspect of the present invention is a method of manufacturing a semiconductor device, which method comprises: forming an insulating layer on a semiconductor substrate; forming a single conductive layer comprising aluminum or an aluminum alloy having an upper surface and a lower surface above the insulating layer; converting the upper surface of the conductive layer to form a substantially amorphous anti-reflective upper portion extending into the conductive layer leaving the remainder of the conductive layer substantially crystalline; forming a photoresist layer on the upper surface; image-wise exposing and developing the photoresist layer to form a mask defining a conductive pattern; and etching the conductive layer through the photoresist mask to form a pattern of conductive lines having an interwiring spacing less than about 1 micron.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

MODES FOR CARRYING OUT THE INVENTION

Figure 1A:
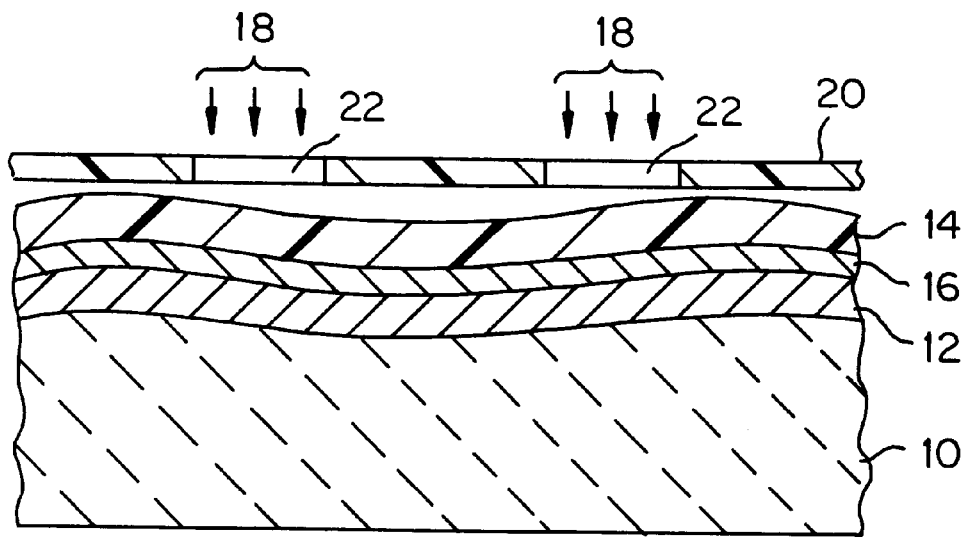
FIGS. 1A, 1B and 1C schematically depict sequential steps in a conventional method for forming a metal interconnection pattern.
Figure 1B:
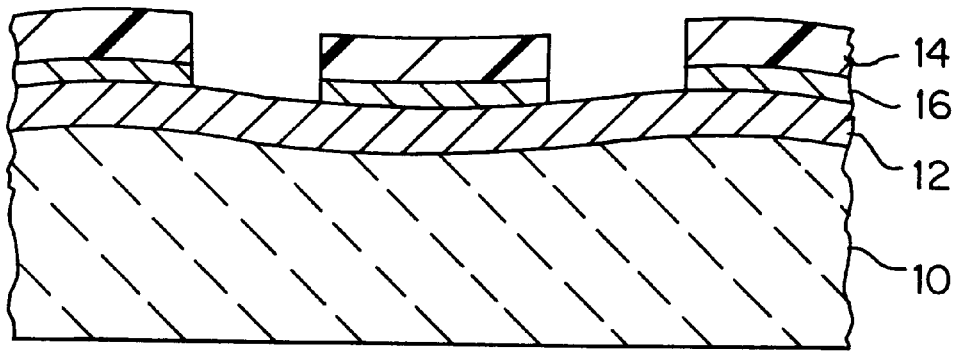
Figure 1C:
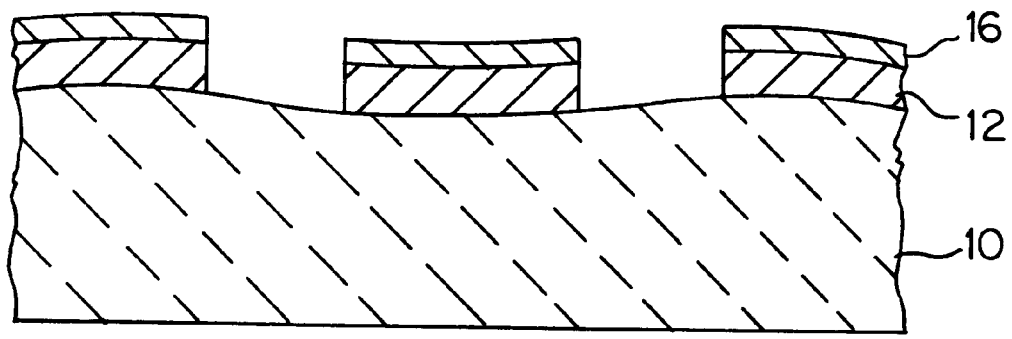

The present invention provides efficient and highly cost-effective methodology to form a conductive pattern, particularly a conductive pattern comprising a plurality of highly reflective metal lines having minimal interwiring spacings, e.g., below 1 micron, without the necessity of depositing an anti-reflective coating of a material different from that of the metal pattern. Thus, the present invention avoids the time consuming deposition of an anti-reflective coating such as titanium nitride on an aluminum or aluminum alloy layer, along with its inherent limitations with respect to incompatible photoresist materials, and its attendant adverse economic consequence in terms of time, material, manipulative steps and additional equipment.

The broad concept underlying the present invention comprises the formation of an anti-reflective upper layer on a conductive layer, wherein the anti-reflective upper layer comprises the same material as the conductive layer. In an embodiment of the present invention, the reflectivity of the upper surface of a conductive layer is altered to form an anti-reflective upper portion extending from the upper surface into the conductive layer. The reflectivity of the upper portion can be reduced by altering the electronic structure of the upper portion. The electronic structure of the upper portion can be altered by implanting a species of atoms heavier than the atoms of the conductive layer. One having ordinary skill in the art, given the objectives of the present invention, could easily select the appropriate atomic species for implantation and implantation dosage to form an anti-reflective upper portion in a conductive layer. It has been found that the reflectivity of the upper portion of a metal layer can be reduced to less than 50% of the reflectivity of the remaining portion of the metal layer by ion implantation.

In a preferred embodiment of the present invention, a metal layer, such as aluminum, an aluminum alloy, copper or a copper alloy, is deposited and the upper portion of the metal layer is converted into a substantially amorphous upper portion by ion implantation. Such an amorphous upper portion exhibits a reflectivity significantly less than the remainder of the substantially crystalline conductive layer, thereby serving as an anti-reflective upper portion. For example, when forming a conductive interconnection pattern comprising aluminum or an aluminum alloy, impurity ions, such as Ge, Si, Ar, Xe, Kr, or another metal species, preferably Ge or Si, are implanted into the surface of the aluminum layer to render it amorphous thereby, insitu, forming an anti-reflective upper portion extending from the upper surface into the aluminum or aluminum alloy layer. It has been found that such an amorphous anti-reflective upper portion can be formed in an aluminum or aluminum alloy layer by implanting Ge or Si at a dosage in excess of about $1 \times 10^{15}$ atoms/cm$^2$.

In carrying out the present invention, one having ordinary skill in the art could easily optimize the implantation dosage to sufficiently reduce the reflectivity of the conductive layer to a sufficient depth from the upper surface to form an effective anti-reflective upper portion. Generally, it has not been found necessary to extend the depth of the anti-reflective upper portion into the conductive layer greater than about 1000Å.

Figure 2A:
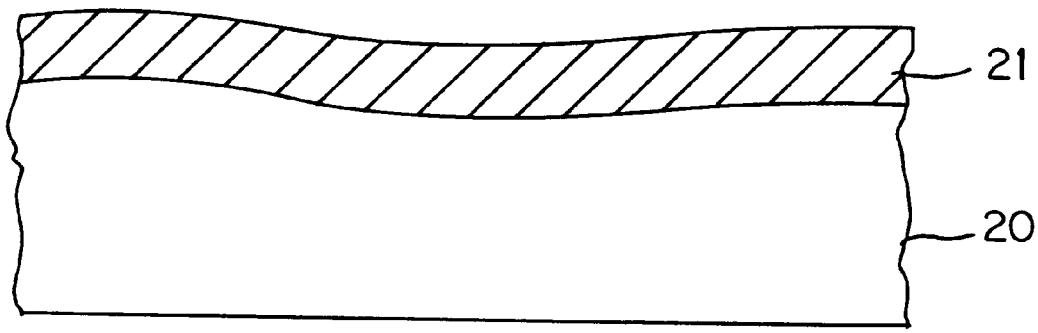
FIGS. 2A through 2E schematically depict sequential steps of a method according to the present invention.
Figure 2B:
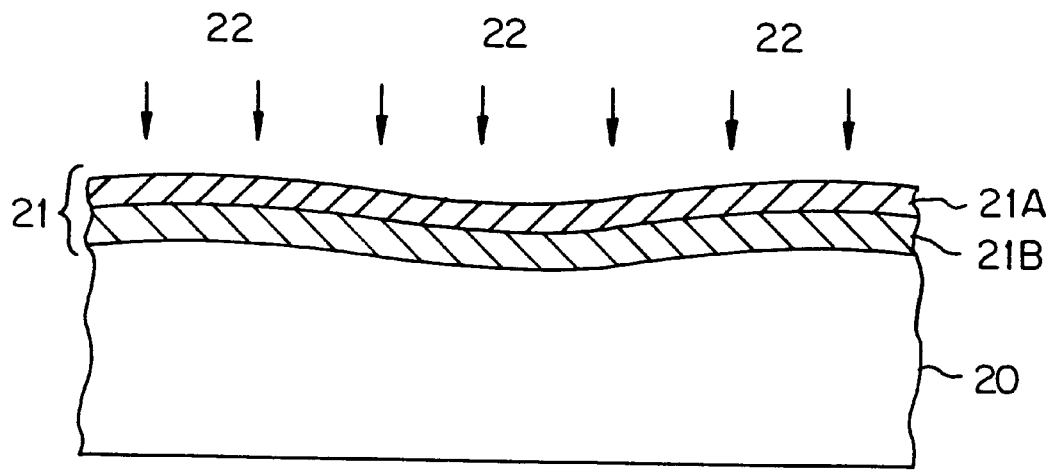

A method of forming and using an anti-reflective upper portion of a conductive layer in accordance with the present invention is sequentially depicted in FIGS. 2A–2D. As in conventional methodology, metal layer 21, such as aluminum, is deposited on an appropriate substrate, such as insulating layer 20 as shown in FIG. 2A. A conventional barrier layer (not shown), such as titanium, titanium nitride, or a composite of titanium and titanium nitride can optionally be provided under metal layer 21. The present invention departs from conventional photolithographic methods by converting a portion of aluminum layer 21 into an anti-reflective upper portion 21A extending into conductive layer 21, as shown in FIG. 2B. With continued reference to FIG. 2B, conductive layer 21 is subjected to ion implantation, indicated by arrows 22. As a result of such ion implantation, the reflectivity of the upper portion of conductive layer 21 is significantly altered. In a preferred embodiment, Si or Ge atoms are implanted into an aluminum layer 21 at a dosage above about $1 \times 10^{15}$ atoms/cm$^2$ to form a substantially amorphous upper portion 21A leaving the remaining portion of the aluminum layer 21B substantially crystalline. Amorphous upper portion 21A functions as an anti-reflection upper portion extending into aluminum layer 21. Thus, the present invention avoids the time consuming, uneconomical conventional practice of depositing an anti-reflective coating of a material different from that of the underlying conductive layer, such as a titanium nitride anti-reflective coating on an aluminum conductive layer, by simply converting a portion of the aluminum layer into an anti-reflective portion.

Figure 2C:
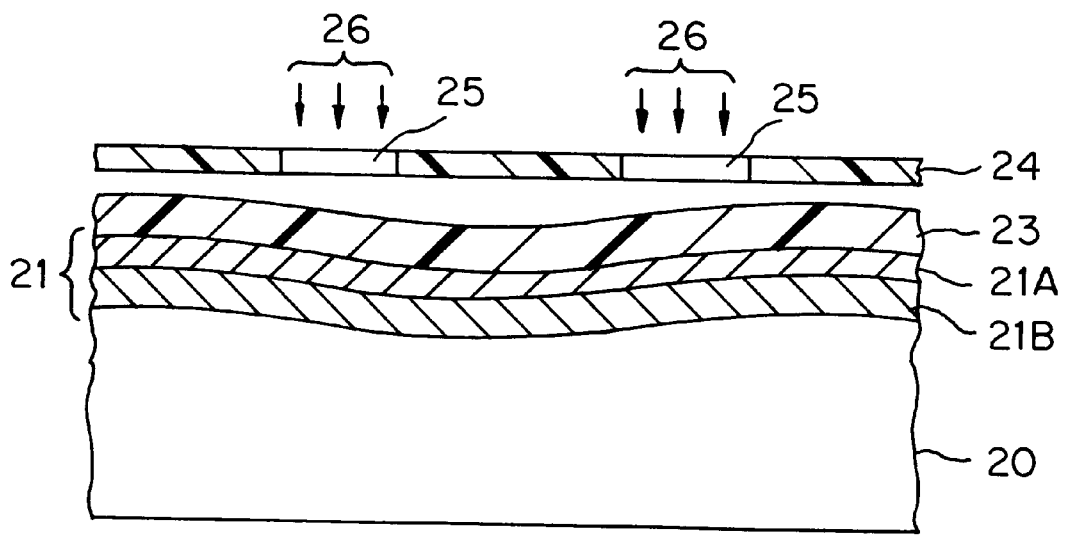
Figure 2D:
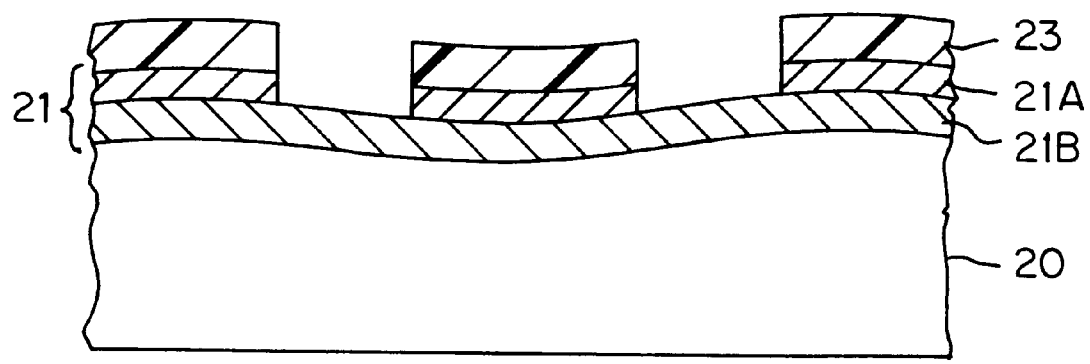

In subsequent processing, as shown in FIG. 2C, a photoresist layer 23 is applied to aluminum layer 21 on anti-reflective upper portion 21A. By avoiding the use of titanium nitride, the photoresist material selected is not limited to those compatible with titanium nitride. A mask 24 is provided on photoresist layer 23. Mask 24 contains apertures 25 through which light rays 26 pass. After development and etching, as shown in FIG. 2D, the exposed portion of photoresist layer 23 is removed. In a subsequent etching step, the exposed sections of underlying anti-reflective upper portion 21A are also removed.

Figure 2E:
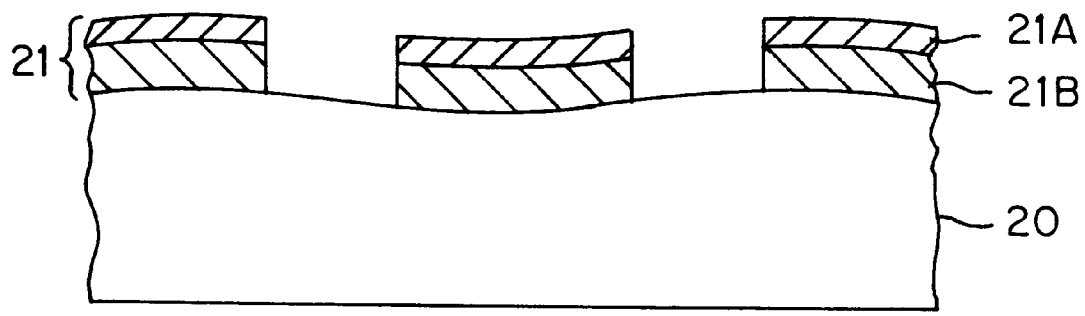

As shown in FIG. 2E, etching is then conducted to form a pattern of conductive lines comprising the remaining sections of substantially crystalline metal layer 21B and amorphous anti-reflective upper portion 21A. Photoresist layer 23 is then removed. The amorphous anti-reflective upper portion of the aluminum layer can be crystallized by heat treatment or during subsequent thermal processing at a temperature at or S above about 400° C.

In a preferred embodiment of the present invention wherein the upper portion of an aluminum or aluminum alloy layer is rendered amorphous to function as an anti-reflective upper portion, particularly accurate photolithographic processing is achieved in that grain-to-grain reflectivity is significantly reduced or eliminated by virtue of the amorphous structure.

Figure 3:
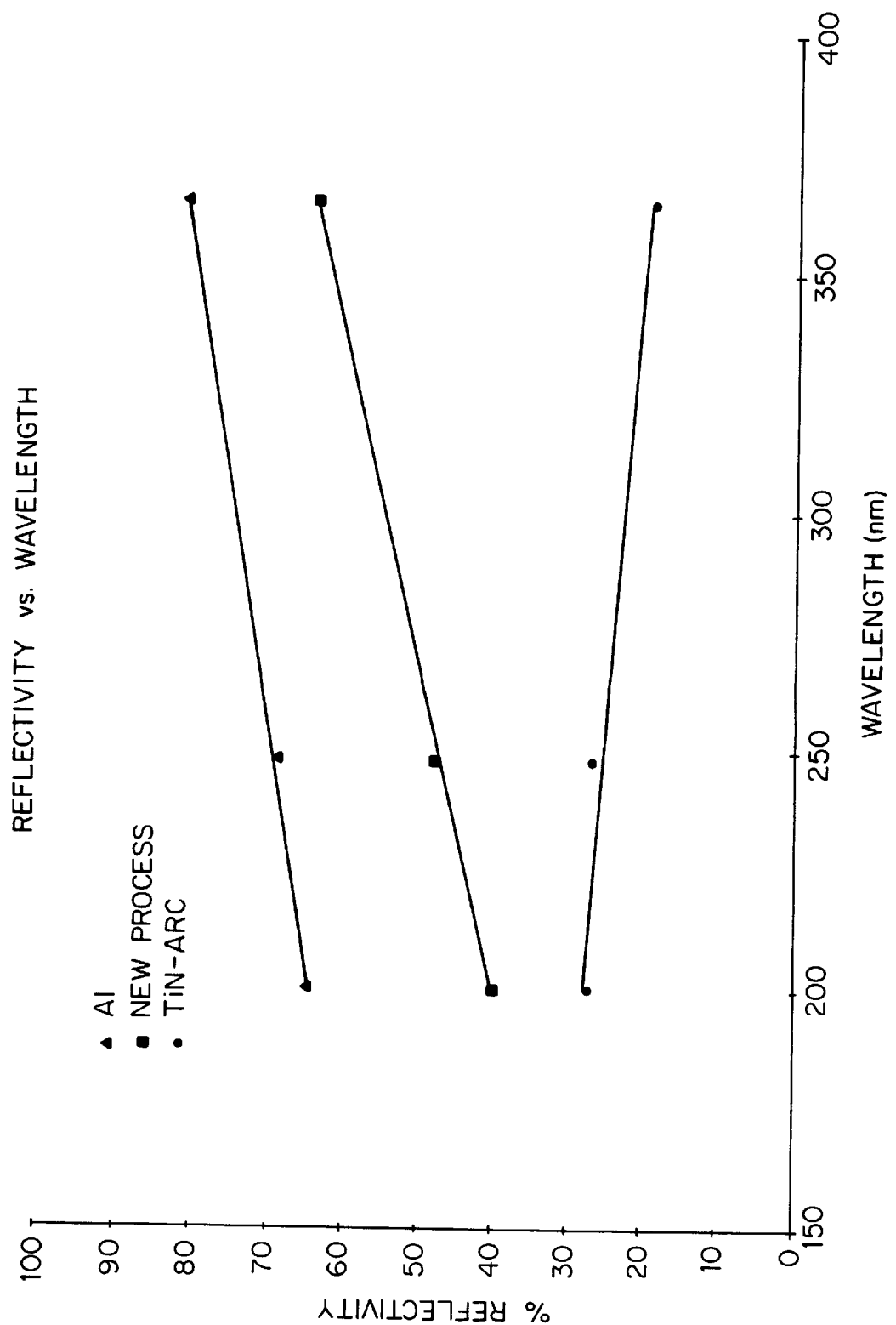
FIG. 3 is a graph showing the reduced reflectivity of an anti-reflective upper portion formed in an aluminum layer in accordance with the present invention.

The present invention provides a particular advantageous reduction in processing costs by forming an aluminum or aluminum alloy interconnection pattern by implanting impurity ions into an aluminum or aluminum alloy layer to form an amorphous anti-reflective upper portion. As shown in FIG. 3, the reflectivity of an aluminum layer is significantly reduced by implanting (silicon/germanium atoms) into an aluminum layer to form an amorphous anti-reflective upper portion. The reflectivity vs. wavelength for a conventional titanium nitride anti-reflection coating on aluminum is also shown. The titanium nitride anti-reflective coating exhibits a lower reflectivity than the amorphous anti-reflective upper portion of aluminum. However, it is considered particularly advantageous to eliminate the need to separately deposit a titanium nitride anti-reflective coating, thereby reducing processing costs, increasing throughput and expanding the choice of available photoresist materials.

The present invention is not limited to any particular type of material for the conductive layer, but preferably employs a metal, such as aluminum, copper or alloys thereof. One having ordinary skill in the art, given the objectives of the present invention and guidance set forth herein, could easily select appropriate atomic species for implantation to alter the electronic structure of the upper portion of the metal layer to sufficiently reduce its reflectivity to perform an anti-reflection function during subsequent photolithographic processing. The present invention encompasses interconnect stacks comprising a main conductive layer, such as an aluminum or aluminum-alloy layer, and a metallic underlayer, e.g., a barrier layer.

The present invention provides manifest advantages in cost reduction, simplification of methodology, reduction in equipment, increased throughput, increased efficiency, and expanded availability of photoresist materials stemming from eliminating deposition a dissimilar anti-reflective coating, particularly a titanium nitride anti-reflective coating on an aluminum layer. The elimination of titanium nitride as an anti-reflective coating on aluminum also avoids the necessity of interposing a barrier layer between the titanium nitride anti-reflective coating and the photoresist material which adversely interacts with titanium nitride. The present invention is not limited to any particular type of semiconductor device, but can be employed in fabricating various semiconductor devices wherein a metallic interconnection pattern is formed, particularly a metallic interconnect pattern having a minimal interwire spacing, such as less than about 1 micron.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A method of manufacturing a semiconductor device, which method comprises:

forming an insulating layer on a semiconductor substrate;

forming a conductive layer having an upper surface and a lower surface above the insulating layer; and implanting impurities to convert the upper surface of the conductive layer into an anti-reflective upper portion extending into the conductive layer and having a reflectivity less than about 50% of the reflectivity of the remainder of the conductive layer.

2. The method according to claim 1, comprising or forming the lower surface of the conductive layer on a lower metallic underlayer.

3. The method according to claim 1, comprising sufficiently reducing the reflectivity of the upper surface to a sufficient depth extending into the conductive layer to form the anti-reflective upper portion.

4. The method according to claim 1, further comprising:

forming a photoresist layer on the upper surface;

image-wise exposing and developing the photoresist layer to form a mask defining a conductive pattern; and etching the conductive layer through the photoresist mask to form a pattern of conductive lines having an inter-wiring spacing less than about 1 micron.

5. The method according to claim 3, wherein the anti-reflective upper portion has a thickness of less than about 1000 Å.

6. The method according to claim 3, wherein the conductive layer comprises a metal and the implanted impurities are heavier than the metal atoms of the conductive layer.

7. The method according to claim 4, wherein the conductive layer comprises aluminum, an aluminum-alloy, copper or a copper-alloy.

8. The method according to claim 7, wherein the conductive layer comprises aluminum or an aluminum-alloy.

9. The method according to claim 8, comprising converting the upper portion from substantially crystalline to substantially amorphous to form the anti-reflective upper portion, leaving the remainder of the conductive layer substantially crystalline.

10. The method according to claim 9, comprising implanting impurity ions at a dosage in excess of about $1 \times 10^{15}$ atoms/cm$^2$ to form the substantially amorphous anti-reflective upper portion.

11. The method according to claim 9, comprising implanting impurity ions selected from the group consisting of Ge, Si, Ar, Xe and Kr.

12. The method according to claim 10, comprising implanting impurity ions of Ge or Si.

13. The method according to claim 10, further comprising heat treating to crystallize the substantially amorphous anti-reflective upper portion.

14. A method of manufacturing a semiconductor device, which method comprises:

forming an insulating layer on a semiconductor substrate;

forming a conductive layer having an upper surface and a lower surface above the insulating layer; and converting the upper surface of the conductive layer from substantially crystalline to substantially amorphous to form an anti-reflective upper portion extending into the conductive layer leaving the remainder of the conductive layer substantially crystalline.

15. The method according to claim 14, comprising implanting impurity ions to form the substantially amorphous anti-reflective upper portion.

16. The method according to claim 14, wherein the conductive layer comprises aluminum or an aluminum-alloy.

17. The method according to claim 16, comprising ion implanting an element selected from the group consisting of Ge, Si, Ar, Xe and Kr.

18. The method according to claim 17, comprising ion implanting Ge or Si.

19. The method according to claim 18, further comprising heat treating to crystallize the substantially amorphous anti-reflective upper portion.

20. A method of manufacturing a semiconductor device, which method comprises:

forming an insulating layer on a semiconductor substrate;

forming a conductive layer having an upper surface and a lower surface above the insulating layer; and ion implanting an element selected from the group consisting of Ge, Si, Xe and Kr to convert the upper surface of the conductive layer to form an anti-reflective upper portion extending into the conductive layer.

21. The method according to claim 3, comprising reducing the reflectivity of the upper portion to less than about 50% of the reflectivity of the remainder of the conductive layer.

22. The method according to claim 20, comprising ion implanting Ge or Si.

23. The method according to claim 20, wherein the conductive layer comprises aluminum or an aluminum-alloy.

24. The method according to claim 23, comprising converting the upper portion from substantially crystalline to substantially amorphous to form the anti-reflective upper portion, leaving the remainder of the conductive layer substantially crystalline.

25. The method according to claim 24, further comprising heat treating to crystallize the substantially amorphous anti-reflective upper portion.

* * * * *